United States Patent [19]

Chen

[11] Patent Number: 5,424,567

[45] Date of Patent: Jun. 13, 1995

[54] PROTECTED PROGRAMMABLE TRANSISTOR WITH REDUCED PARASITIC CAPACITANCES AND METHOD OF FABRICATION

[75] Inventor: Teh-Yi J. Chen, Cupertino, Calif.

[73] Assignee: North American Philips Corporation, New York, N.Y.

[21] Appl. No.: 700,663

[22] Filed: May 15, 1991

[51] Int. Cl.6 ............................................. H01L 29/68
[52] U.S. Cl. .................... 257/315; 257/316; 257/344
[58] Field of Search .................. 357/23.5, 23.4, 23.3, 357/43; 257/315, 316, 322, 324, 336, 344, 408

[56] References Cited

U.S. PATENT DOCUMENTS

| | | |
|---|---|---|
| 4,376,947 | 3/1983 | Chiu et al. |
| 4,630,085 | 12/1986 | Koyama ............................ 357/23.5 |
| 5,005,066 | 4/1991 | Chen ................................. 357/43 |
| 5,079,603 | 1/1992 | Komori et al. ..................... 357/23.5 |

FOREIGN PATENT DOCUMENTS

| | | |
|---|---|---|
| 273728 | 7/1988 | European Pat. Off. |
| 0360504 | 3/1990 | European Pat. Off. ........... 357/23.5 |
| 53-97381 | 8/1978 | Japan . |
| 58-206165 | 12/1983 | Japan . |
| 62-71277 | 4/1987 | Japan ................................ 357/23.5 |
| 2200795 | 8/1988 | United Kingdom . |

OTHER PUBLICATIONS

Kume et al., "A Flash–Erase EEPROM Cell with an Asymmetric Source and Drain Structure," IEDM 1987, pp. 560–563.

Yoshikawa et al., "Extended Abstracts of the 20th Conf. on Solid State Devices and Materials", Tokyo, 1988, pp. 165–168.

*Primary Examiner*—Andrew J. James
*Assistant Examiner*—Courtney A. Bowers
*Attorney, Agent, or Firm*—Paul R. Miller

[57] ABSTRACT

A programmable transistor includes impurity regions to reduce punch-through and soft-write phenomena. In order to provide a fast operation, the impurity regions are arranged with regard to one another so that parasitic capacitances at junctions of impurity regions of mutually opposite conductivity type are minimized. For these purposes, the transistor comprises a charge storage region over a channel region in a main semiconductor zone of a first conductivity type located between a source and a drain of a second conductivity type opposite to the first. A first impurity zone of the first conductivity type, substantially laterally contiguous with the drain, extends into the channel region and is more heavily doped than the main zone. The drain includes a heavily doped third impurity region and a lightly doped second impurity region that lies at least mainly between the third region and the zones.

3 Claims, 2 Drawing Sheets

PROTECTED PROGRAMMABLE TRANSISTOR WITH REDUCED PARASITIC CAPACITANCES AND METHOD OF FABRICATION

FIELD OF THE INVENTION

The invention relates to a programmable transistor with a charge storage region over a channel region in a main semiconductor zone of a first conductivity type located between a source and a drain of a second conductivity type opposite to the first. In addition, the transistor comprises a first impurity zone of the first conductivity type that extends into the channel region and is more heavily doped than the main zone. The drain includes a heavily doped impurity region and a lightly doped impurity region. The invention further relates to a method of fabricating such a device.

BACKGROUND ART

Programmable transistors are well known and form, for instance, the basic constituents of an erasable programmable read-only memory (EPROM) or an erasable programmable logic device (EPLD). One of the ways to change the charge state of the charge storage region is by means of the so-called channel hot-carrier injection mechanism.

HOT-CARRIER INJECTION

The channel hot-carrier-injection mechanism can be explained as follows. Charge carriers are accelerated in the channel from the source to the drain. On the average, the kinetic energy of the charge carriers is larger in the vicinity of the drain than near the source. Due to collisions in the crystal lattice, the charge carriers are scattered in all directions. By creating an electric field directing the scattered carriers towards the charge storage region, the number of those that are scattered in that direction is enhanced. Some of these carriers penetrate the electrically insulating layer that isolates the channel from the charge storage region if their acquired energy is high enough. These carriers are thereupon trapped in the charge storage region and give rise to a modification of the transistor's threshold voltage. Sensing the logic state of the programmable transistor is accomplished by discriminating between a high and a low threshold voltage.

DOWNSCALING PROBLEMS

The trend to provide faster integrated circuits and higher transistor densities forces technologists to seek ways to fabricate ever smaller transistors. However, the scaling down of a transistor, and in particular a programmable transistor, presents a variety of intertwined problems, several of which are considered briefly below.

I. APPLIED VOLTAGES

The electric fields in a small transistor may be too high for the structure to withstand and may cause the transistor's destruction. High electric fields are related to large voltage differences over short distances. Although lowering the voltages to be applied to the structure may give some relief, it does so at the expense of operating speed and programming efficiency.

II. PUNCH-THROUGH

Another problem relates to a phenomenon called "punch-through" or "drain-induced turn-on", which occurs as a result of a strong capacitive coupling between the drain and the charge storage region (e.g., floating gate). When the drain voltage is raised, the capacitive coupling causes the voltage of the charge storage region to follow the drain voltage upward. If the voltage of the charge storage region is pushed beyond the transistor's threshold voltage, a channel develops and the transistor is turned on.

III. SOFT WRITE

Still another problem concerns the appearance of a soft write, i.e., an unintended programming during a read operation on an unprogrammed transistor, due to an electric field that is too high near the drain. As is known, the channel of a field effect transistor is created by forming an inversion layer. The inversion layer is a surface region of the substrate, whose conductivity type is inverted by the local electric field. The electric field is caused by voltage differences between the control gate, the charge storage region and the substrate's surface. The voltage at the surface is not uniform. In the conducting state of the transistor, the voltage difference between the channel and the charge storage region is largest near the source and decreases in the direction of the drain. Where the voltage difference approaches zero, the inversion layer vanishes. The vanishing location is called the pinch-off point. The position of the pinch-off point depends, among other things, on the drain voltage. An increase in the drain voltage causes the pinch-off point to lie farther away from the drain.

At the pinch-off point, charge carriers propagate out of the inversion layer into the drain depletion layer, where they are accelerated by the depletion layer's electric field. The charge carriers may acquire sufficient energy for, upon being scattered by the substrate's crystal lattice, reaching the charge storage region. If this takes place during a read operation, a spurious write process occurs.

PRIOR ART SOLUTIONS

A variety of solutions that alleviate the above problems is known in the art.

I. VOLTAGES

Various prior art programmable transistors include a layer which is of the same conductivity type as the substrate, which has a higher impurity concentration than the substrate and which extends into the transistor's channel region. See, for instance: Yoshikawa et al., "Extended Abstracts of the 20th Conf. on Solid State Devices and Materials, Tokyo, 1988, pp. 165–168 and U.S. Pat. No. 4,376,947 by Chiu et al. (FIGS. 7 and 8).

In Yoshikawa et al., an N-channel programmable transistor is provided with a multi-profile N-type drain embedded in a P-type layer having a higher impurity concentration than the P-type substrate. The P-type layer extends into the channel region. In Chiu et al., an N-channel programmable transistor has a drain with a shallow lightly doped N region and a laterally adjacent deep heavily doped N region. Only the lightly doped N region borders a P-type layer more heavily doped than the P-type substrate. Both prior art P-type layers are said to improve the efficiency of the writing mechanism. This relates to the generation of the strategically localized high electric field due to the higher concentration of fixed charges (ions, as contrasted with the mobile charges: electrons and holes) in the P-type layer when a channel is formed. For a given applied voltage, the spatial relationship between the channel's pinch-off point and the location of the P layer may be optimized with regard to the current injection into the charge storage region in the programming mode.

II PUNCH-THROUGH

In Yoshikawa et al., the punch-through problem is reduced by means of the P layer mentioned above. This P layer is said to improve the punch-through resistance, since it slightly raises the threshold voltage beyond the value at which current conduction occurs. In European Patent Application EP-A 273 728 by Sato, a similar P layer separating a multi-profile N-type drain from the substrate is said to prevent punch-through.

III. SOFT WRITE

In Yoshikawa et al., the hot-carrier generation in the read mode is reduced by providing the N-type drain with a lightly doped N portion that laterally extends partway underneath the charge storage region. The channel's pinch-off point in the read mode is positioned in this N layer. The location of the N layer may be optimized with regard to current injection into the charge storage region in the programming mode.

OBJECTS OF THE INVENTION

The known structures discussed above solve the soft write and the punch-through problems to some extent. However, they also introduce parasitic effects that slow down the operation speed. Adjacent layers of mutually opposite conductivity types form junction capacitances that represent additional loads to be charged and discharged during the transistor's operation and thereby reduce operation speed.

It is therefore an object of the invention to provide a programmable transistor that is protected against punch-through and soft-write, and that permits faster operation than known programmable transistors. It is a further object to provide a fast programmable non-volatile memory and a fast programmable logic device. It is another object to provide a method to fabricate such a programmable transistor.

GENERAL DISCLOSURE

The programmable transistor in the invention comprises a charge storage region that overlies a channel region in a main semiconductor zone of a first conductivity type. The channel region is located between a source and a drain of a second conductivity type opposite to the first. The transistor further includes, substantially laterally contiguous with the drain, a first impurity zone of the first conductivity type that extends into the channel region and is more heavily doped than the main zone. The drain incorporates a heavily doped third impurity region and a lightly doped second impurity region that lies substantially between the third region and the zones.

With smaller dimensions, parasitic effects, such as pn-junction capacitances, become more pronounced. The junction capacitance increases if at least one of the impurity concentrations on either side of the junction is raised. In the programmable transistor according to the invention, the various impurity domains now have been arranged and shaped in such a way as to reduce, with respect to the prior art transistors, the junction capacitances present between two contiguous domains of mutually opposite conductivity types. The drain's lightly doped second region is an interface between at least a major portion of the heavily doped third impurity region and the main zone. The first impurity zone is kept small and borders the drain's lightly doped second impurity region.

The expressions "heavily doped" and "lightly doped" are used to indicate relative net impurity-concentrations that are associated with domains of the same conductivity type.

In practice, the drain's second and third impurity regions generally do not have a sharp, well-defined interface. It should therefore be noted, that the terms "second impurity region" and "third impurity region", as presented here, relate to an aggregated impurity distribution, wherein the junction capacitance is substantially determined by the drain's low-level impurity concentration, and wherein the drain's ohmic resistance, with regard to the current conducted by the transistor, is determined substantially by the high-level impurity concentration.

The programmable transistor is fabricated, for example, from a monocrystalline semiconductor body that comprises a surface-adjoining main zone of a first conductivity type. A charge storage region, for instance, a floating gate, is created over a channel region in the main zone. Using the charge storage region as a mask, a first dopant of the first conductivity type is introduced into the main zone for providing a first impurity zone of the first conductivity type that extends into the channel region and that is more heavily doped than the main zone. Thereupon, a second dopant of a second conductivity type opposite to the first is introduced into the main zone for furnishing a lightly doped second impurity region substantially laterally contiguous with the first impurity zone. This can be accomplished, for instance, by counterdoping the first impurity region completely, except for the portion thereof that extends into the channel region. For this purpose a spacer is formed over the first impurity region and alongside the charge storage region. A third dopant of the second conductivity type is introduced into the second impurity region for creating a surface-adjoining third impurity region that is substantially embedded in and more heavily doped than the second region. A second spacer is therefore provided over the second region and alongside the charge storage region. The first and second spacers determine the required lateral arrangement of the first, second and third regions.

Further details and advantages are dealt with below for typical embodiments that will be clarified by means of the accompanying drawing.

BRIEF DESCRIPTION OF THE DRAWING

The invention will be explained by way of example and with reference to the accompanying drawing in which:

FIGS. 7–10 are enlarged compared to FIGS. 1–6.

DETAILED DESCRIPTION OF THE FIGURES

FIGS. 1–10 show an example of a method for fabricating a self-aligned floating gate programmable transistor (EPROM transistor, one-time-programmable or UV-erasable, for example) in accordance with the invention. The illustrated method forms part of a more extensive BiCMOS process. Only those intermediate results are considered here that directly relate to the construction of the programmable transistor shown.

METHOD

Figure 1:
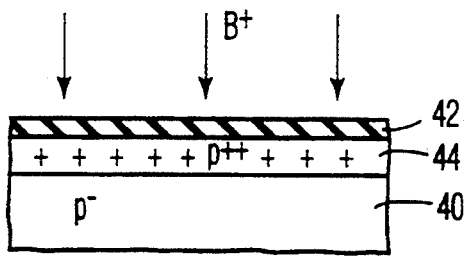
FIGS. 1–10 show an example of a method for fabricating a programmable transistor according to the invention.

Referring to FIG. 1, over a lightly doped P-type <100> monocrystalline silicon substrate 40, a silicon dioxide layer 42 is thermally grown to a thickness of approximately 200–400 nm. A blanket boron ion implant ($B^+$) at a dose of $10^{13}$ cm$^{-2}$ at 30 KeV is performed, followed by a thermal anneal, typically at 950° C. for 30–60 minutes in a dry oxygen ambient, leaving a moderately doped P-type layer 44. This layer 44 will prevent latch-up phenomena in the completed device.

Figure 2:
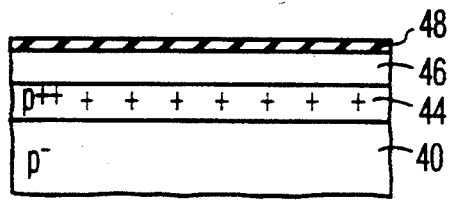

Referring to FIG. 2, after stripping oxide layer 42 and performing a cleaning step, a thin intrinsic (dopant concentration no more than $10^{15}$ cm$^{-3}$) epitaxial layer 46 is formed to a thickness of 0.8–1.0 um over layer 44. A thin thermal silicon dioxide 48 having a thickness of 30 nm is grown over epitaxial layer 46.

Figure 3:
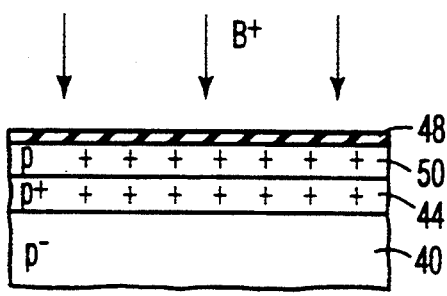

Referring to FIG. 3, a P-type domain 50 is formed by means of a boron implant at a dose of $2-2.5 \times 10^{12}$ cm$^{-2}$ at 100 KeV and a subsequent anneal and drive-in step typically at 1050° C. for 60–90 minutes in a nitrogen ambient.

Figure 4:
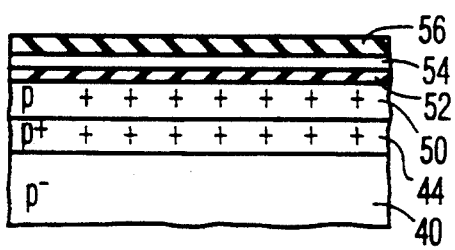

Referring to FIG. 4, a wet oxide strip is carried out for removing oxide layer 48. A new thin silicon dioxide layer 52 that has a thickness of 15–25 nm and that later will provide the gate dielectric is thermally grown in a dry oxygen ambient at 900°–950° C. An amorphous silicon layer 54, having a thickness of 40–70 nm, is deposited over oxide layer 52 by means of an LPCVD process at a temperature of 550° C. Thereupon, a silicon nitride layer 56 is deposited over layer 54 to a thickness of 150–250 nm by means of an LPCVD process at 800° C.

Figure 5:
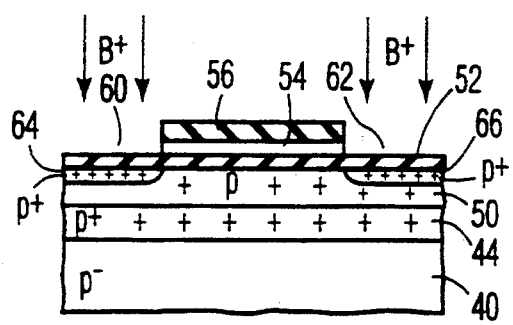

Referring to FIG. 5, using a suitable photoresist mask (not shown), a dry etch is performed to remove portions of nitride layer 56 and amorphous silicon layer 54, thereby defining locations 60 and 62 for LOCOS growth. A subsequent boron ion implant results in heavily doped P+ anti-inversion regions 64 and 66.

Figure 6:
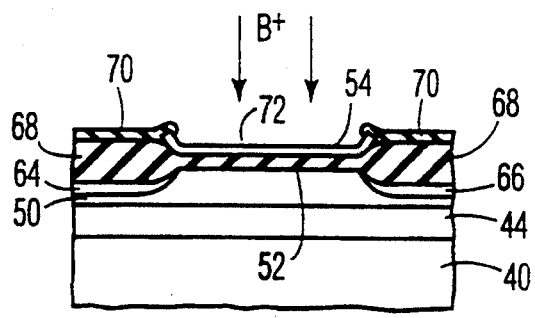

Referring to FIG. 6, a field oxidation is done at 900°–1000° C. to create an oxide layer 68 (LOCOS) of thickness 600–700 nm over exposed regions 60 and 62. Note that P+ regions 64 and 66 move downward ahead of LOCOS 68 as it forms. Thereupon, nitride layer 56 is stripped in hot phosphoric acid, and a low-temperature oxide (LTO) layer 70 of thickness 70–100 nm is formed at 420° C. An etch of LTO layer 70 exposes the cell area 72 for a boron implant at 50 KeV with a dose of $5-8 \times 10^{12}$ cm$^{-2}$. This adjusts the threshold voltage of the completed device. Parts of amorphous-silicon layer 4 that are not covered by LTO layer 70 are P-type doped according to a POCl$_3$ technique. Subsequently, a combined deglazing- and LTO-removing step is carried out.

Figure 7:
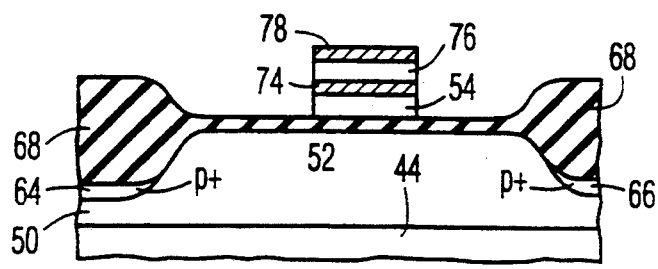

Referring to FIG. 7, now in enlarged representation, a dielectric ONO interpoly film 74 is formed. Formation of ONO film 74 includes first growing a 10–15 nm silicon dioxide layer at 900°–1075° C., then depositing a 10–15 nm silicon nitride layer by means of an LPCVD process at 800° C., and finally forming a 2 nm silicon dioxide layer by oxidation of the nitride layer at 900°–920° C. A further amorphous silicon layer 76 of 250–300 nm thickness is deposited by means of an LPCVD process at 550° C. A low-temperature oxide deposition (LTO) is thereupon done to form a thin layer 78 of 100 nm thickness. A dry etch is performed to partially remove portions of LTO layer 78, amorphous silicon layer 76, interpoly film 74 and amorphous silicon layer 54. The remaining parts of layers 54 and 74–78 form a stacked-gate structure.

Figure 8:
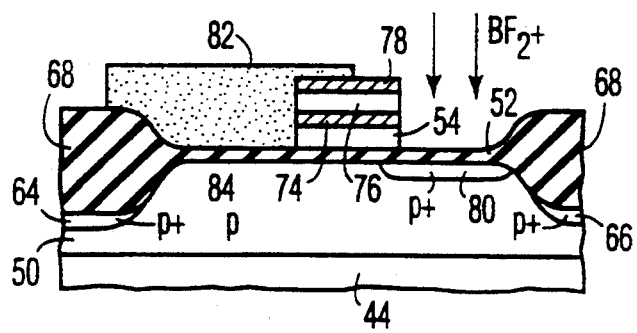

Referring to FIG. 8, an implant is performed to create a P-type pocket 80 in the monocrystalline silicon adjacent to the stacked-gate structure. P-type pocket 80 is preferably located laterally contiguous with N-type drain extension 92 without completely encompassing N-type drain extension 92 within main semiconductor zone 50. For this purpose, a photoresist mask 82 is formed over region 86 where the source of the programmable transistor is going to be formed. Pocket 80 is done by a boron difluoride ion implant at 50 KeV and a dose of $3-5 \times 10^{13}$ cm$^{-2}$. A thermal drive step at 900° C. for 30–60 minutes in a nitrogen ambient may be performed to adjust the implant's profile.

Figure 9:
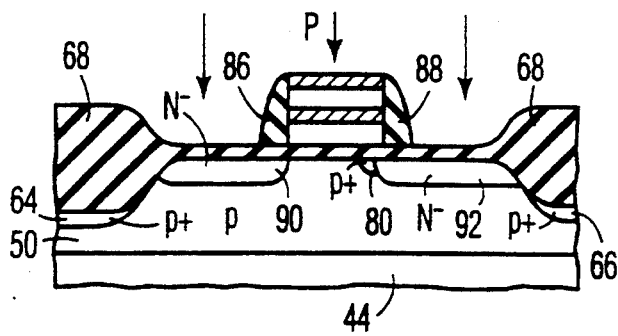

Referring to FIG. 9, silicon dioxide spacers 86 and 88 are formed along the sides of the stacked-gate structure by thermal oxidation. Thereupon, lightly doped N-type source extension 90 and lightly doped N-type drain extension 92 are created by means of a phosphorus ion implant at 40–50 KeV at a dose of $5 \times 10^{13} - 5 \times 10^{14}$ cm$^{-2}$. A subsequent thermal drive at 900°–1000° C. for 30–60 minutes in a nitrogen ambient is preferably performed to adjust the profiles obtained in this and the previous implants. This phosphorus implant partially counterdopes part of P pocket 80. Note that the spacer thickness determines the lateral width of the remaining part of P pocket 80 adjacent to lightly doped drain extension 92.

Figure 10:
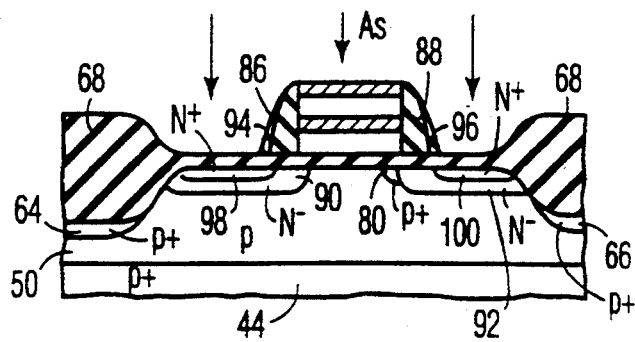

Referring to FIG. 10, a second set of spacers 94 and 96 is formed by an LTO deposition/anisotropic etch process. A further N-type implant is performed with arsenic at 100 KeV at a dose of $5-7 \times 10^{15}$ cm$^{-2}$. This creates heavily doped N-type parts 98 and 100 in the transistor's source- and drain regions, and, in addition, dopes amorphous silicon layer 76. Next an anneal step is performed at 920°–950° C. for 30–90 minutes in a nitrogen ambient.

Subsequent fabrication steps known in the art do not relate to the programmable transistor in particular and will therefore not be discussed.

In order to fabricate a programmable transistor suitable for use in a flash EEPROM some alterations have to be introduced into the method discussed above. The main change relates to the thicknesses of various layers mentioned. Oxide layer 52 for a flash EEPROM cell will amount to 9–12 nm in order to reduce the tunneling voltage. The dimensions of the layers constituting ONO interpoly film 76 are slightly different with regard to the ones mentioned above. For the flash EEPROM, the lower silicon dioxide layer is typically 7–11 nm thick, the nitride layer formed on top thereof is typically 10–12 nm, whereas the upper silicon dioxide top layer is likewise 2 nm thick.

TRANSISTOR STRUCTURE

Due to the arrangement of the various impurity domains with respect to one another as shown in FIG. 10, the associated pn-junction capacitances are reduced considerably with respect to the prior art arrangements. Configurations wherein junctions are present with high impurity concentrations at both sides are avoided as much as possible. Heavily doped N-region 100 is shown to be shielded from main zone 50 and P-type pocket 80 owing to interposed lightly doped N-type region 92. Consequently, the junction capacitances are smaller than in the case of heavily doped, neighboring impurity domains of mutually opposite conductivity types. Since smaller capacitances mean shorter charge- and discharge-times, a memory circuit implemented with transistors of the shown kind operates faster.

P pocket 80 enhances the channel's electric field in the program mode. The location of pocket 80 optimizes the site of the hot-carrier generation in the program mode. In addition, pocket 80 prevents punch-through by locally raising the threshold voltage required to convert the part of main zone 50 underneath the stacked-gate structure into a conduction channel. Lightly doped N-type region 92 prevents a soft write from occurring in the read mode if the channel's pinch-off point should be located beyond pocket 80, thereby preventing the electrons from gaining too much energy.

Strictly speaking, in case of an EPROM transistor, it is not necessary to provide the source with a profiled impurity distribution, such as embodied by the combination of regions 90 and 98, similar to the one of the drain. However, by doing so, an additional mask layer for providing the drain with a double profile while leaving the source only having a single profile is left out. This may facilitate the transistor's fabrication. In case of an EEPROM transistor however, such a profiled source enables a high voltage to be safely applied to the source for erasing.

I claim:

1. A programmable transistor with a charge storage region over a channel region in a main semiconductor zone of a first conductivity type located between a source and a drain of a second conductivity type opposite to the first, and with, substantially laterally contiguous with the drain without completely encompassing the drain within the main semiconductor zone, a first impurity region of the first conductivity type that extends into the channel region over only a part of the channel region and is more heavily doped than the main zone, the drain having a heavily doped second impurity region and a lightly doped third impurity region that lies substantially between the second region and the zone.

2. A transistor as in claim 1 wherein the source includes a heavily doped fourth impurity region and a lightly doped fifth impurity region substantially between the fourth region and the main zone.

3. A transistor as in claim 1 wherein the charge storage region includes a floating gate.

* * * * *